United States Patent [19]

Bozler et al.

[11] Patent Number: 5,155,561
[45] Date of Patent: Oct. 13, 1992

[54] PERMEABLE BASE TRANSISTOR HAVING AN ELECTRODE CONFIGURATION FOR HEAT DISSIPATION

[75] Inventors: Carl O. Bozler, Sudbury; Steven Rabe, West Roxbury; Mark A. Hollis, Concord; Christopher T. Harris, Somerville; Kirby B. Nichols, Chelmsford, all of Mass.

[73] Assignee: Massachusetts Institute of Technology, Cambridge, Mass.

[21] Appl. No.: 140,820

[22] Filed: Jan. 5, 1988

[51] Int. Cl.⁵ .................. H01L 29/80; H01L 29/72
[52] U.S. Cl. .................................. 357/22; 357/34
[58] Field of Search .................. 357/15, 22; 353/34

[56] References Cited

U.S. PATENT DOCUMENTS

| | | | |
|---|---|---|---|
| 3,946,334 | 3/1976 | Yonezu et al. | 331/94.5 |
| 4,086,611 | 4/1978 | Nishizawa | 357/22 |
| 4,378,629 | 4/1983 | Bozler et al. | 29/580 |
| 4,735,918 | 4/1988 | Parsons et al. | 437/90 |
| 4,901,121 | 2/1990 | Gibson et al. | 357/22 |
| 4,903,090 | 2/1990 | Yokoyama | 357/22 |
| 5,106,778 | 4/1992 | Hollis et al. | 437/90 |

FOREIGN PATENT DOCUMENTS 2613537 10/1988 France .................. 357/22

OTHER PUBLICATIONS

Halliday et al., *Fundamentals of Physics*, 1981, pp. 356-358.
Bozler et al., "Fabrication and Numerical Simulation of the Permeable Base Transistor," IEEE on Elec. Dev., Jun. 1980, pp. 1128-1141.
IBM, "Multiple Grid Permeable Transistor," IBM Tech. Discl. Bulletin, Oct. 1988, pp. 40-43.
Kenji Kani et al., "Heat Transfer Analysis of Beam-- Lead Transistor," Electronics and Communications in Japan, vol. 53-C, No. 6, 1970, pp. 157-164.

*Primary Examiner*—Jerome Jackson, Jr.
*Assistant Examiner*—Donald L. Monin, Jr.
*Attorney, Agent, or Firm*—Hamilton, Brook, Smith & Reynolds

[57] ABSTRACT

The base layer of a power permeable base transistor is formed as comb structures with grating teeth of the combs extending into active regions of semiconductor material. Extended active regions are separated by inactive regions over which collector contacts extend. Large devices have digitated base layers. The comb structures are fabricated by sputtering a uniform layer of tungsten and forming a nickel mask over the tungsten by both X-ray and photolithography techniques. The tungsten exposed by the nickel mask is then etched to leave the comb structures.

35 Claims, 9 Drawing Sheets

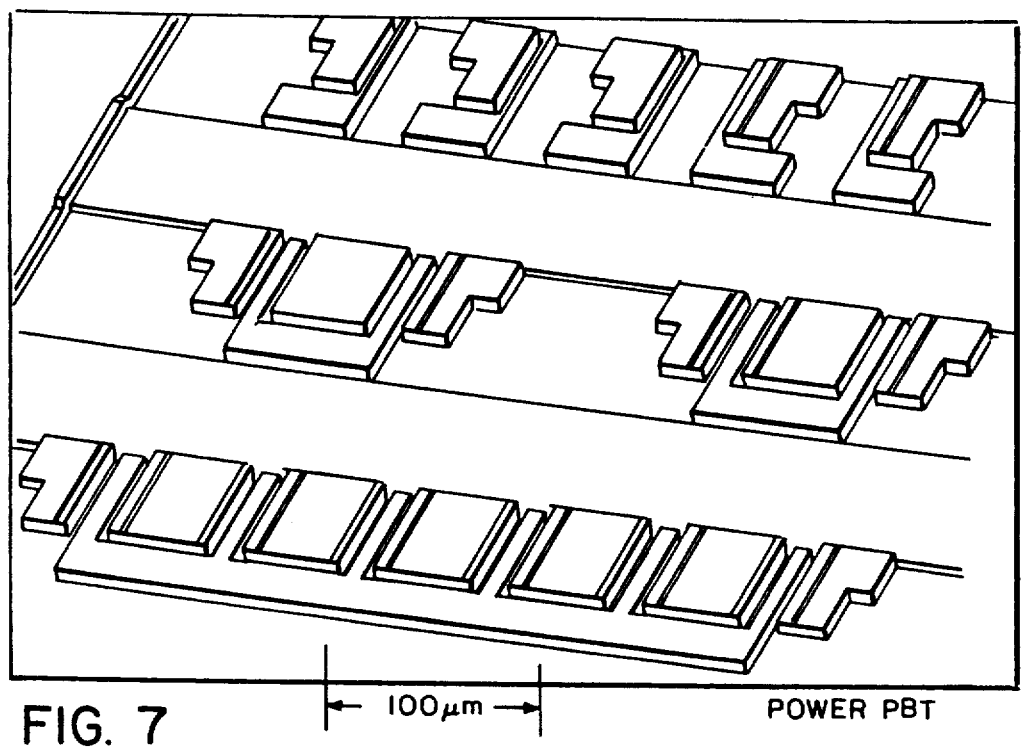
FIG. 7  ←100μm→  POWER PBT
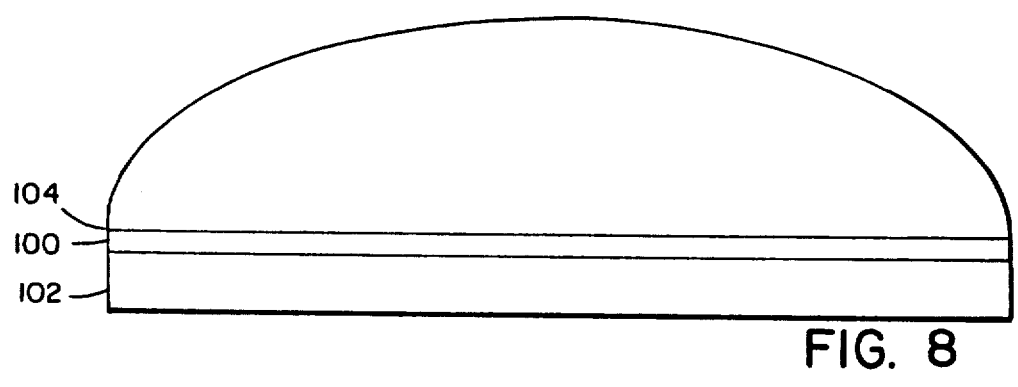
FIG. 8
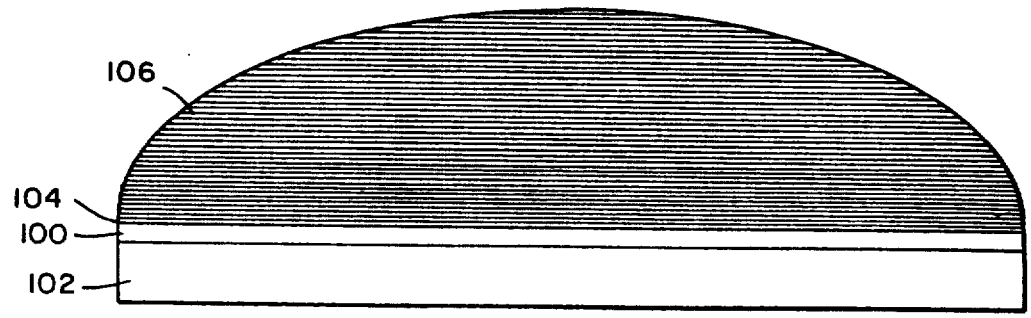
FIG. 9

PERMEABLE BASE TRANSISTOR HAVING AN ELECTRODE CONFIGURATION FOR HEAT DISSIPATION

GOVERNMENT RIGHTS

The U.S. Government has rights to this invention in that it was sponsored by the Department of the Air Force, the Defense Advanced Research Projects Agency and the Air Force Office of Scientific Research under Contract No. F19628-85-C-0002.

BACKGROUND OF THE INVENTION

Vertical transistors offer the advantages of greater density across a wafer than do lateral designs such as conventional field effect transistors. One such vertical transistor device is the permeable base transistor (PBT) described in U.S. Pat. No. 4,378,629 to Bozler et al. In that transistor, a metal base layer is sandwiched between single crystal emitter and collector regions. The base layer has openings therein which may be provided by forming the base as a grating. With sufficiently narrow openings in the grating, the metal semiconductor Schottky barrier provides for barrier-limited current flow.

Numerous applications exist for a transistor capable of providing amplification and power generation at EHF frequencies. Sufficiently fast two-terminal devices are presently available, but there is a need for three-terminal devices which provide greater isolation of input and output signals in an analog circuit. The high gain and power added efficiency of the PBT at frequencies in the order of 20 GHz makes it particularly suited to high frequency power applications. The present invention relates to an improved design which particularly adapts the permeable base transistor and other vertical transistors, such as the heterojunction bipolar transistor and vertical field effect transistor, to power applications.

DISCLOSURE OF THE INVENTION

Attempts to use prior designs of the PBT in power applications have resulted in excessive current densities in collector contacts which lead to electromigration of the metal of the contacts and ultimate burnout. Further, the compactness of the PBT results in problems in heat dissipation in power applications.

In accordance with the present invention, a vertical transistor device comprises first and second semiconductor regions vertically displaced in semiconductor material with the first region nearer the surface. (The terms "vertical" and "horizontal" are used only for reference relative to the semiconductor surface and do not limit the orientation of the device.) The two regions are separated by a control layer. The semiconductor material has a vertical active region through the first and second regions. That active region has an extended horizontal length which is substantially greater than either the width or depth of the region. In a permeable base transistor, the control layer includes a metal grating, and the active first and second regions serve as collector and emitter. An extended control electrical contact, or base contact, is coupled to the control layer along an extended length thereof to one side of the active region. An extended first region electrical contact, or collector contact, is coupled to the active first region along its length. The first region contact also extends laterally away from the control contact over the surface of an inactive region.

With the first region contact extending out from an elongated active region, a substantial amount of heat generated in the active region can be conducted out over a relatively large area of the semiconductor material for thermal conduction through the inactive region of the semiconductor material. At least 50 percent, and preferably 75 percent, of the heat is conducted from the active region through the contact.

The lateral extension of the first region contact from the elongated active region also allows for minimal concentration of the current flowing from the active region through the contact. Current density can also be reduced by providing a thick, gold contact. Preferably, the contact is at least about as thick as the active region is wide. In a permeable base transistor having an active region 4 microns wide, the gold collector contact is greater than 2 microns thick and is preferably 4 microns thick.

In a preferred implementation, the control contact comprises fingers interleaved with first region contacts. A first region contact may extend between and connect to parallel active regions corresponding to adjacent control contact fingers. Conductive wires may be bonded to the first region contacts and connected in common for a single device. In a PBT application, the control layer in adjacent active regions coupled to a contact finger comprises gratings formed as teeth from opposite sides of a grating pad in a double-sided comb structure.

In a preferred method of forming the comb structure of the PBT, a uniform layer of the base metal is applied to the semiconductor substrate without the pattern. A mask of the high resolution portions of the layer, that is, the base grating teeth, is then formed over the metal layer using at least a high resolution technique such as X-ray lithography. Specifically, a grating made of a masking material is formed over an entire wafer using X-ray lithography, and portions of the grating mask are then removed using a lesser resolution technique such as photolithography. A lesser resolution technique is also used to form a mask of the grating pads of the comb structures. Portions of the metal layer not covered by the mask are removed. Finally, the mask material is removed. Using this technique, a uniform metal layer can be formed using sputtering techniques, and the final metal structure contains both high and lesser resolution patterns but includes no metal overlays.

In the PBT, metal comprising tungsten is particularly suited to the base layer. Nickel is particularly suited as the mask because the nickel can be etched using nitric acid without harming the tungsten or photoresist and can be removed with hydrochloric acid without harming the tungsten or gallium arsenide; and the tungsten can be etched using flourine gas without harming the nickel or gallium arsenide.

The first semiconductor region is then epitaxially grown over the base grating.

Metal contacts, including layers which are alloyed for an ohmic contact, are deposited through a single mask after proton bombardment. Preferably, the layers which are alloyed are gold, germanium and nickel, and those layers are separated from a thick, gold layer by a barrier layer.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 7 is a perspective view of the top of a wafer showing devices formed in the configurations of FIGS. 2, 4 and 5.

FIG. 8 illustrates a wafer, cut away during an early stage of the fabrication process.

FIG. 9 illustrates the wafer after a grating mask has been formed over the wafer.

DESCRIPTION OF PREFERRED EMBODIMENTS

Figure 1:
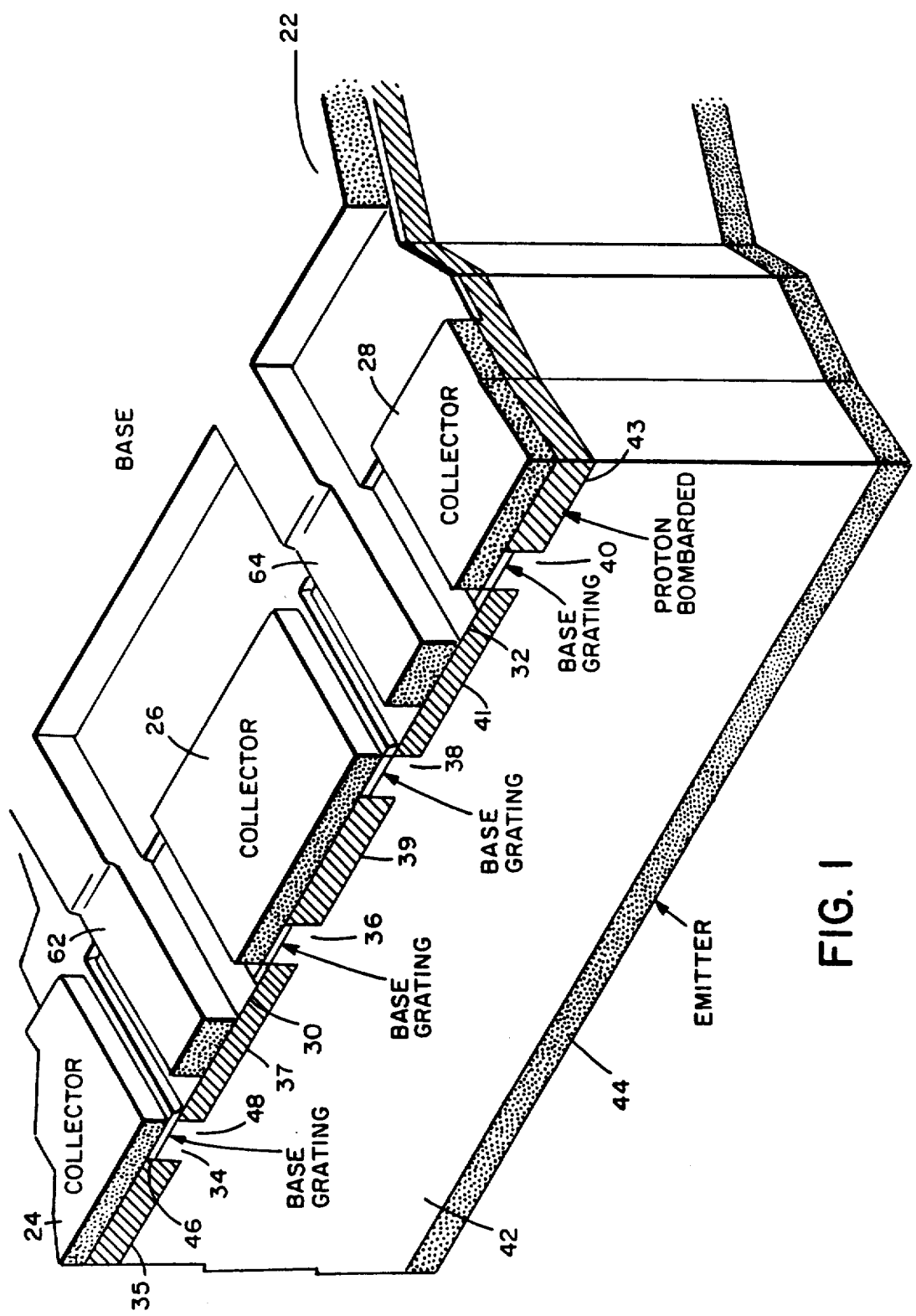
FIG. 1 is a perspective cutaway of a permeable base transistor device embodying the present invention.
Figure 2:
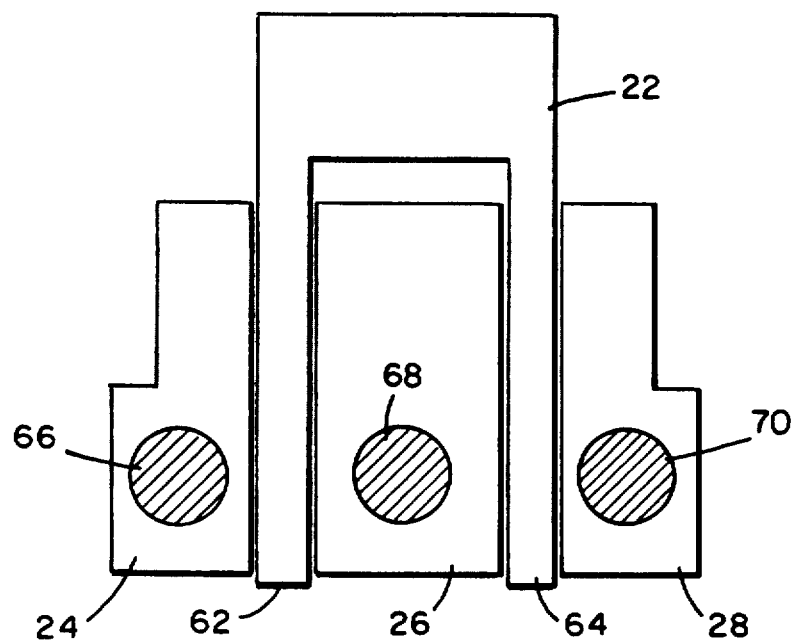
FIG. 2 is a plan view of the base and collector electrodes of the device of FIG. 1.
Figure 3:
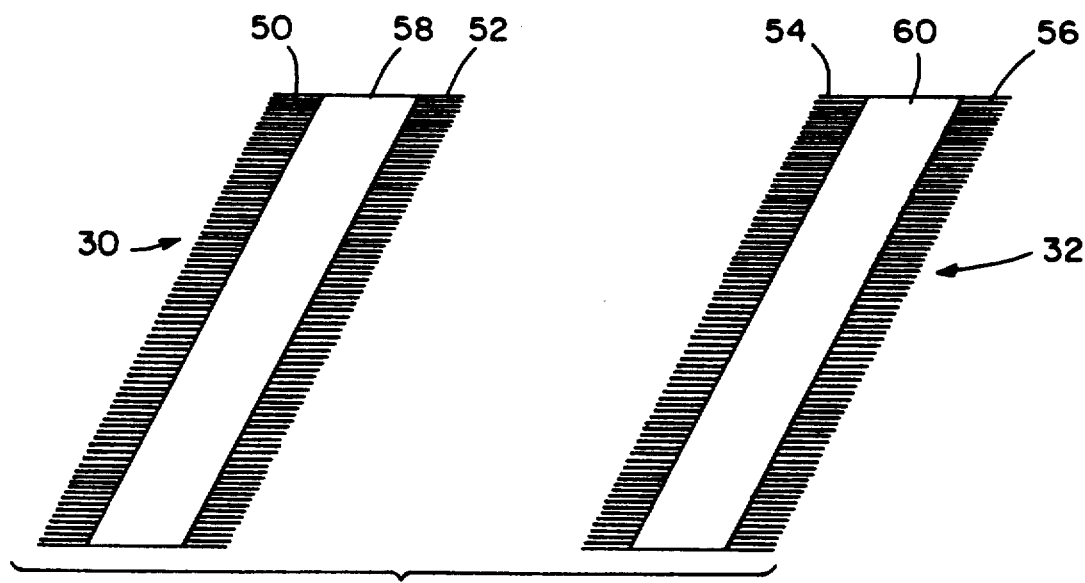
FIG. 3 is a perspective view of the base gratings of the transistor of FIG. 1.

One embodiment of the power PBT fabricated in accordance with the present invention is illustrated in FIG. 1, 2 and 3. FIG. 1 is a perspective cutaway of the device. FIG. 2 is a plan view of the base contact 22 and the collector contacts 24, 26 and 28. FIG. 3 is an illustration of the two comb structures 30 and 32 forming the metal base layer.

The device of FIG. 1 has four vertical active regions 34, 36, 38 and 40 in the single crystal gallium arsenide substrate 42. The active regions are separated by inactive regions 35, 37, 39, 41 and 43. An emitter contact 44 is formed on the bottom surface of the substrate, and the collector contacts 24, 26 and 28 are coupled to the upper surface of the active regions. The emitter and collector roles may be reversed. The contact 26 is shared by the two regions 36 and 38. Each active region is divided into a first upper collector region 46, and a second lower collector region 48 by a tungsten grating of one of the structures of FIG. 3. Specifically, the grating teeth 50 extend through the active region 34, grating teeth 52 extend through active region 36, grating teeth 54 extend through active region 38 and grating teeth 56 extend through active region 40. The gratings extend from central grating pads 58 and 60 to which fingers 62 and 64 of the base contact 22 are coupled.

In a preferred design, the overall structure illustrated in FIG. 2 is about 150 microns by 200 microns. The collector contact 26 is 50 microns by 100 microns. The base fingers are about 14 microns wide, and the joining portion of the base contact is about 40 microns by 80 microns. Each comb structure of FIG. 3 is about 100 microns long and 32 microns across from tip to tip of the grating teeth.

In previous designs of the PBT, a ten-micron-wide grating was coupled to grating pads to either side of the active region. The collector contact had an eight-micron width directly over the active region between the grating pads and extended to a connector pad at one end of the active region. In power applications, excessive current density resulted in the collector contact near the pad. Current density of greater than 100,000 A/cm$^2$ results in electromigration of the metal which can result in burnout. In accordance with the present invention, the grating extends into each active region from a single side of the extended active region, and the collector contact to each active region extends laterally away from the base contact over an inactive region where it serves as a connector pad. These connector pads may be connected in common by means of wires 66, 68 and 70 (FIG. 2) which are bonded to the pads as by thermal compression or ultrasonic bonding. As a result of this configuration, current need not be transferred down the length of a narrow collector contact. Rather, current from the narrow active regions is transferred laterally through the wide collector contact to the wires 66, 68 and 70.

In order to minimize the base resistance due to the tungsten film, the active regions should be less than about 5 microns wide, and in a preferred implementation are only about 4 microns wide. These narrow active regions also minimize current density and facilitate heat dissipation as is discussed below. To provide a larger transistor, the plural, narrow active regions are provided. Further, because the lateral collector contact makes the current density much less dependent on the length of the active region, a longer active region of 100 microns, or perhaps 200 microns, as compared to about 40 microns of prior devices, is possible.

Figure 16A:
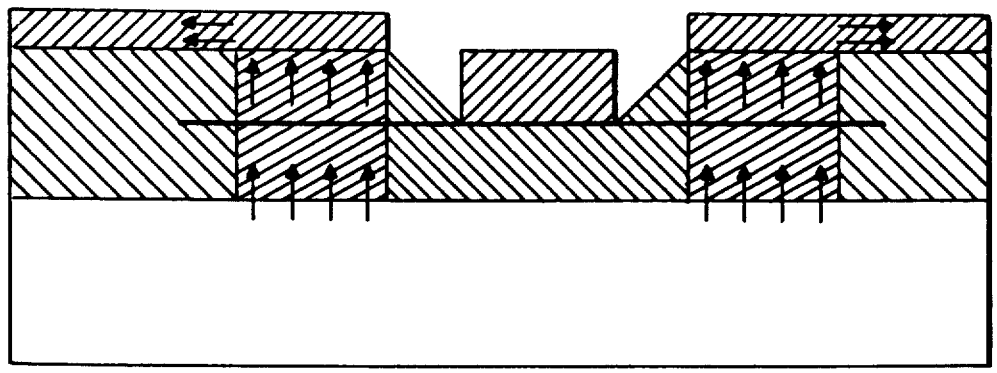
FIG. 16A and 16B illustrate current density in the gold collector contact using two thicknesses.
Figure 16B:
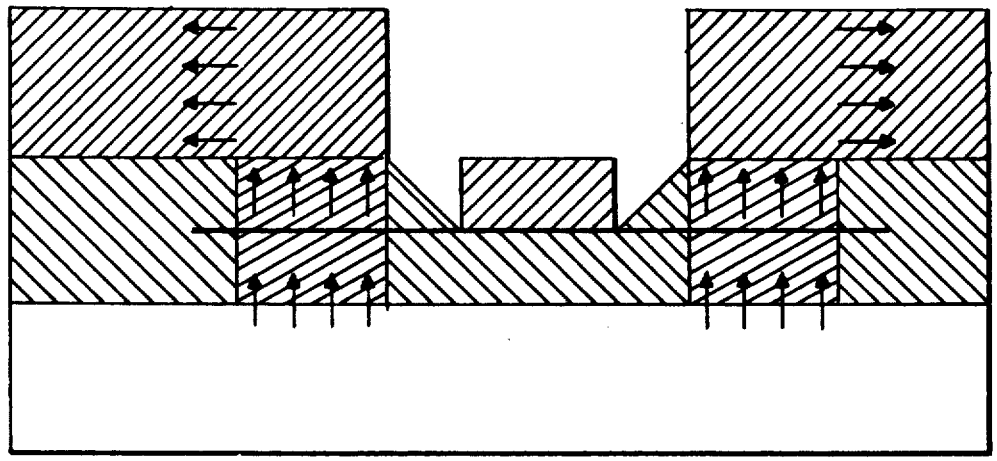

A thicker collector contact than has previously been used also minimizes current density in the collector contact. As illustrated by FIG. 16B, current density in the contact at the active region is the same as that in the active region where the contact is as thick as the active region is wide. As illustrated in FIG. 16A, current density is higher in the contact if the contact thickness is decreased or the active region width is increased. It is best that the thickness of the collector contact be at least as great as half the width of the active region. Thus, a gold contact of at least 2 microns, and preferably 4 microns, is used.

Figure 15A:
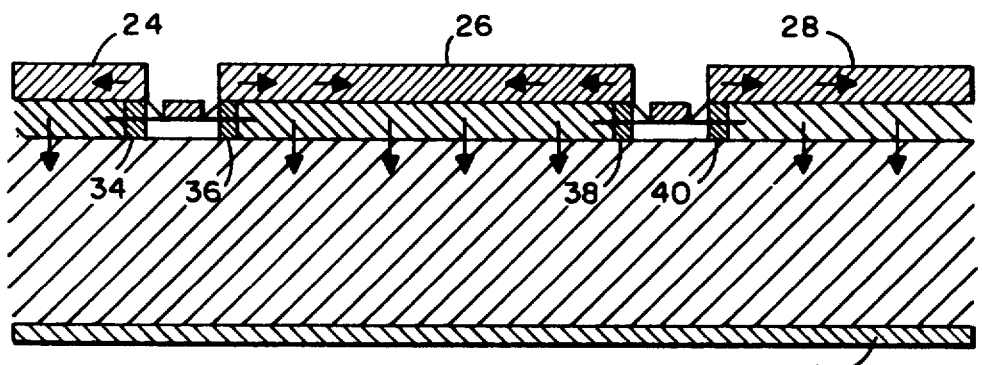
FIGS. 15A and 15B illustrate two modes of heat flow from the active regions of the device of FIG. 1.
Figure 15B:
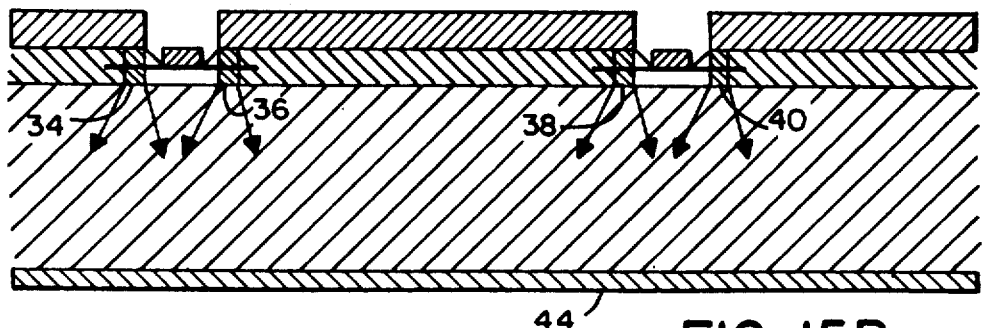

With the relatively high electrical resistance in the active region, the current flow through the gallium arsenide region generates a significant amount of heat. Dissipation of that heat through the gallium arsenide substrate to the emitter contact is a particular problem due to the high power density of the vertical transistor arrangement. In prior devices, heat dissipation has primarily been from the active regions directly downward through the substrate as illustrated in FIG. 15B. Because of the relatively low conductivity of about 0.46 watts/cm° C. of gallium arsenide, that conduction of heat from the small cross-sectional area below the active regions is inadequate in a power transistor, and the operating temperature can become sufficiently high to cause premature burnout. As illustrated in FIG. 15A, the laterally extending contacts of the present invention allow for spreading of the heat over a large surface area over inactive regions of the substrate to provide for a much larger effective cross-sectional area of conduction and thus a much larger conductance. The gold contacts have a relatively high thermal conductivity of about 1.8 watt/cm° C. and thus provide for rapid removal of the heat from the active regions across the relatively large inactive regions.

It can also be recognized that the narrow, extended active regions provide for greater conductance directly down through the substrate. The heat is not only conducted directly down from the active regions but also spreads as illustrated in FIG. 15B. For a given cross-sectional area of active region, a long, narrow region provides for a greater amount of such spreading and thus increases the thermal conductance.

Wider collector contacts allow for greater heat dissipation. However, those contacts should not be so wide as to result in excessive parasitic capacitance, the capacitance between the collector contacts and the substrate on the other side of proton-bombarded inactive regions. In most designs, the parasitic capacitance should be kept below about 10 percent of the intrinsic device capacitance when the device is fully turned on. As a rule, assuming that 400 KeV protons are used for creating the inactive, insulating region, the area of the collector contact should be not greater than eight times the area of the active regions for best high frequency performance. For devices used at lower frequencies, larger capacitance and thus larger area ratios of collector contact to active regions may be acceptable.

Figure 4:
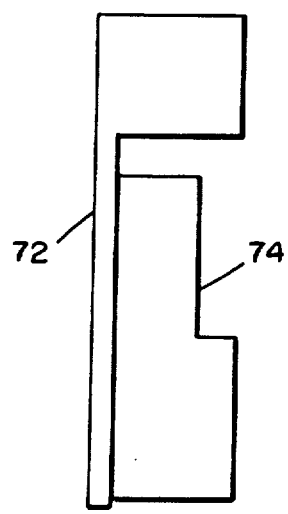
FIG. 4 is a plan view of an alternative contact arrangement having a single base finger.

FIG. 4 illustrates a configuration suitable for a small device which does not require the digitated base contact of FIG. 2. In this configuration, the base contact extends adjacent to a single extended active region disposed just below the lower left edge of the collector contact 74. The overall dimensions of this device are about 60 microns by 150 microns.

Figure 5:
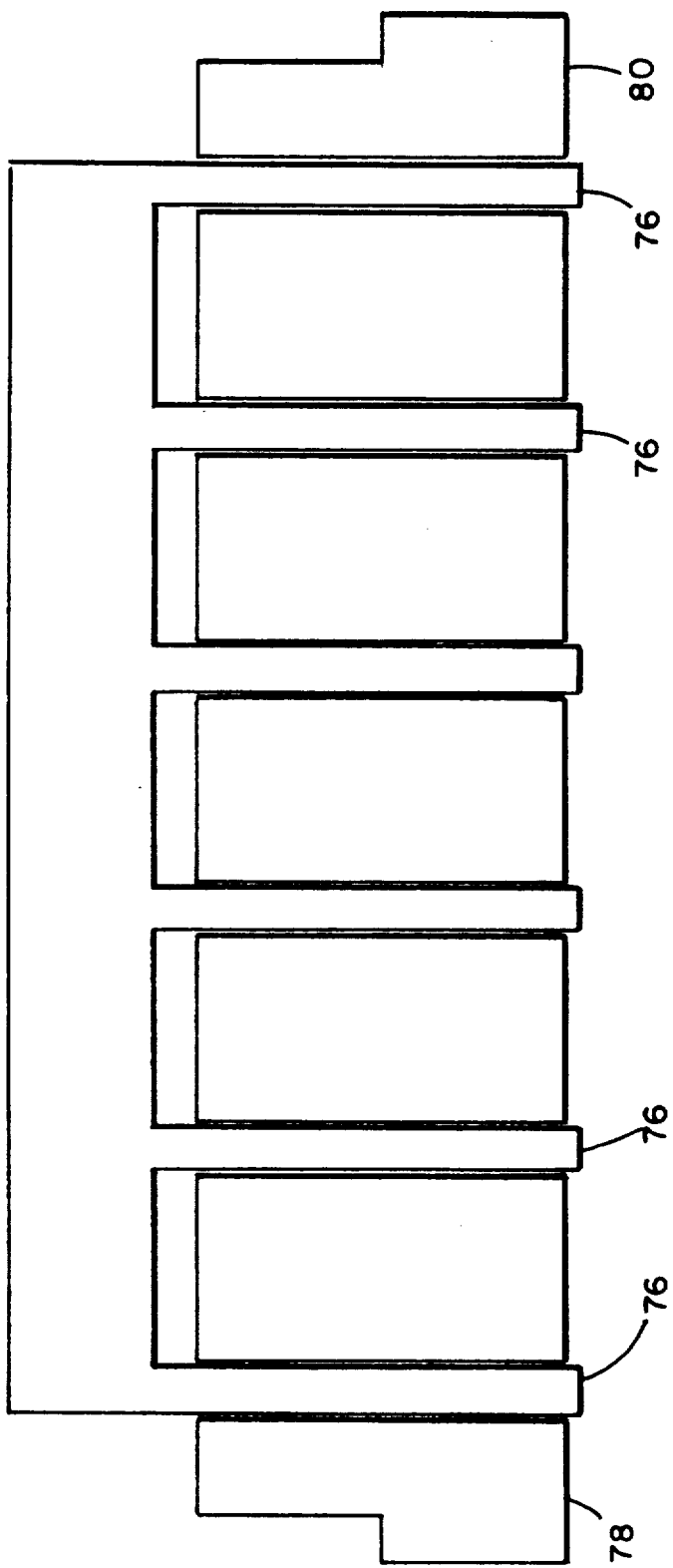
FIG. 5 is a plan view of the base and collector contacts of yet another configuration.

A much larger device having six base electrode fingers 76 and thus six comb structures, such as those illustrated in FIG. 3, is shown in FIG. 5.

In each of the configurations of FIGS. 1-5, each inner collector contact which spans an inactive region between adjacent active regions may be coupled to a single bonding wire. Thus, each wire is shared by adjacent active regions. The inner collector contacts of the disclosed embodiments are 50 microns wide. Collector contacts associated with the outer active regions, such as contacts 78 and 80 in FIG. 5, would only be 25 microns wide using the same contact width per active region width. However, those contacts would then be too narrow for easy bonding of a 25-micron-diameter wire. Therefore, lateral flags are provided on those end contacts to allow for bonding of the bonded wires. This results in an increase in parasitic capacitance.

Figure 6:
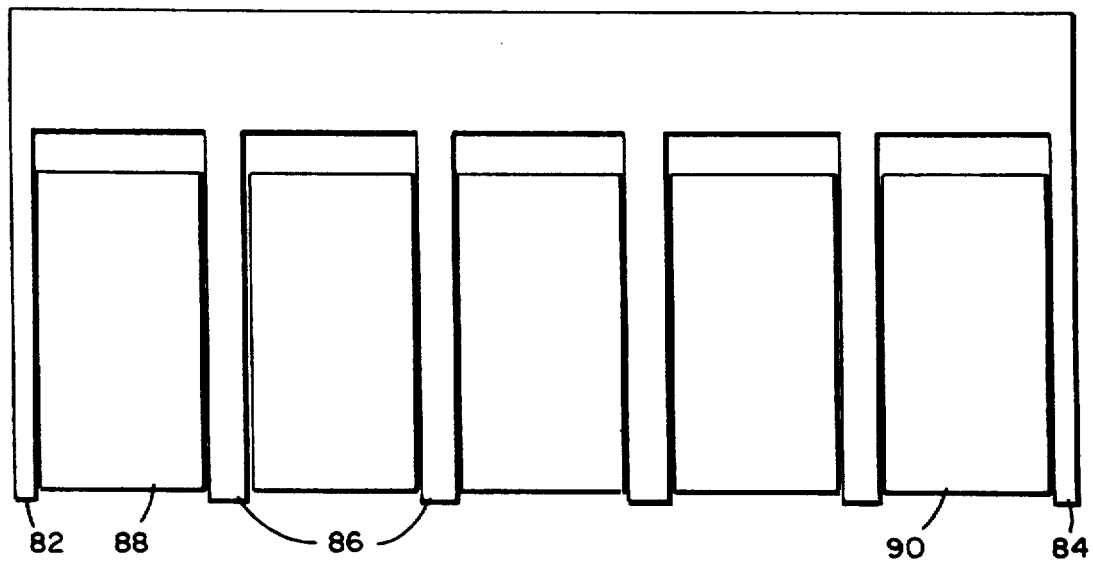
FIG. 6 is a plan view of a further configuration of a PBT.

In the embodiment of FIG. 6, no active regions are provided at the ends of the device. Therefore, the end base contact fingers 82 and 84 have half the width of the intermediate fingers 86. Also, the base combs positioned below the end base contacts would be half the combs illustrated in FIG. 3 with the grating teeth extending inward under the collector contacts 88 and 90.

As a further illustration of devices fabricated in accordance with the present invention, the upper surface of a wafer having discrete devices as illustrated in FIGS. 2, 4 and 5 is shown in the perspective view of FIG. 7.

A novel technique for fabricating the transistor devices thus far described will now be discussed with reference to FIGS. 8-14. As illustrated in FIG. 8, an epitaxial layer 100, approximately 2,000 angstroms thick, is grown on a gallium arsenide substrate 102. A layer 104 of tungsten in which the metal base gratings are ultimately formed is then sputtered onto the epitaxial layer to a thickness of about 300 angstroms. A mask is then formed over the tungsten layer to allow for etching of the tungsten to leave the comb structures illustrated in FIG. 3. To that end, using high resolution X-ray lithography, an image is developed in polymetholmethacrylate (PMMA), a known X-ray-sensitive resist. Approximately 400 angstroms of nickel are deposited. Then, with liftoff by dissolving the PMMA, the nickel grating illustrated in FIG. 9 having a periodicity of approximately 3,200 angstroms with a line-to-space ratio of one is maintained. X-ray lithography is generally described by D.C. Flanders, *J. Vac. Sci. Technol.*, 16(6), Nov./Dec. 1979. Other high resolution techniques which allow for the formation of gratings having a periodicity of less than one micron include electron beam lithography, ion beam lithography and masked ion beam lithography.

Figure 10:
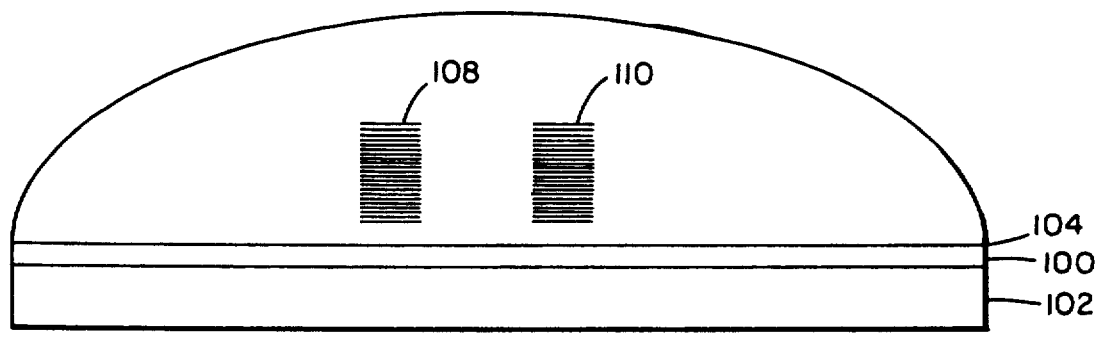
FIG. 10 is an illustration of the wafer of FIG. 9 after portions of the grating mask have been removed.
Figure 11:
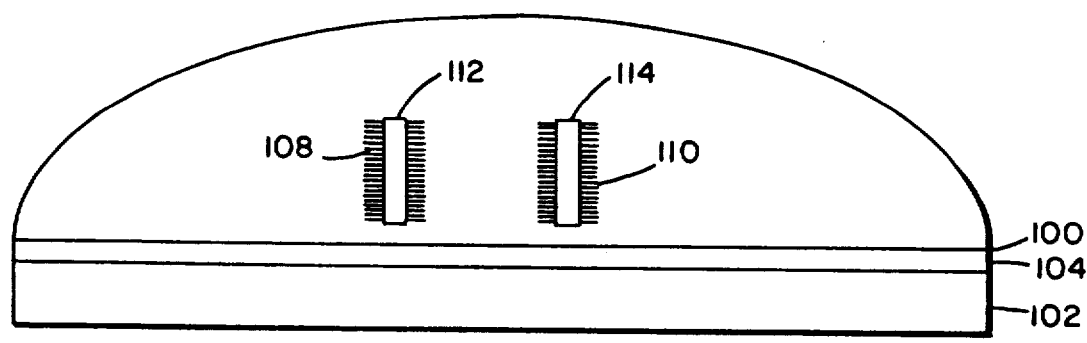
FIG. 11 is an illustration of the wafer of FIG. 10 after masks for the grating pads of the base layers have been laid.

FIGS. 10 and 11 illustrate the formation of mask for a pair of comb structures of FIG. 2. It should be recognized that many more such comb structures would be formed on a wafer in a single process. With a lower resolution photolithography technique, a photoresist mask is applied over the grating 106 to cover regions 108 and 110 of FIG. 10. Then the nickel grating exposed by the photoresist mask is etched by dilute nitric acid. The photoresist is then removed to expose the gratings 108 and 110. Then another layer of photo resist is applied using photolithography such that openings in the resist are left over the regions 112 and 114 which correspond to the grating pads of the comb structures. Four hundred angstroms of nickel are then evaporated through those openings to form the mask for the gratings pads. With removal of the resist and liftoff, the nickel mask illustrated in FIG. 11 corresponding to the combs is left. By means of a reactive ion etching (RIE) technique using $CF_4$ or equivalent flourine gas, the tungsten which is exposed around the nickel mask of FIG. 11 is etched away. The nickel may then be removed by hydrochloric acid to leave the tungsten combs.

An advantage of the above-described technique for laying the tungsten combs is that the process allows a uniform layer of tungsten to be sputtered onto the epitaxial layer. Sputtered tungsten has a higher density and a lower resistance than does evaporated tungsten, but it is difficult to use sputtering with resist liftoff techniques. Also, with the resultant single sputtered film of tungsten, there are no overlays of tungsten, in an area such as the gratings pads over the gratings, so it is less likely that impurities are trapped or that cracks or holes develop. An advantage of using nickel as the mask over the tungsten is that the nickel is not attacked by the flourine gases used to etch the tungsten, and tungsten is not attacked by the nitric or hydrochloric acid used to etch the nickel.

Figure 12:
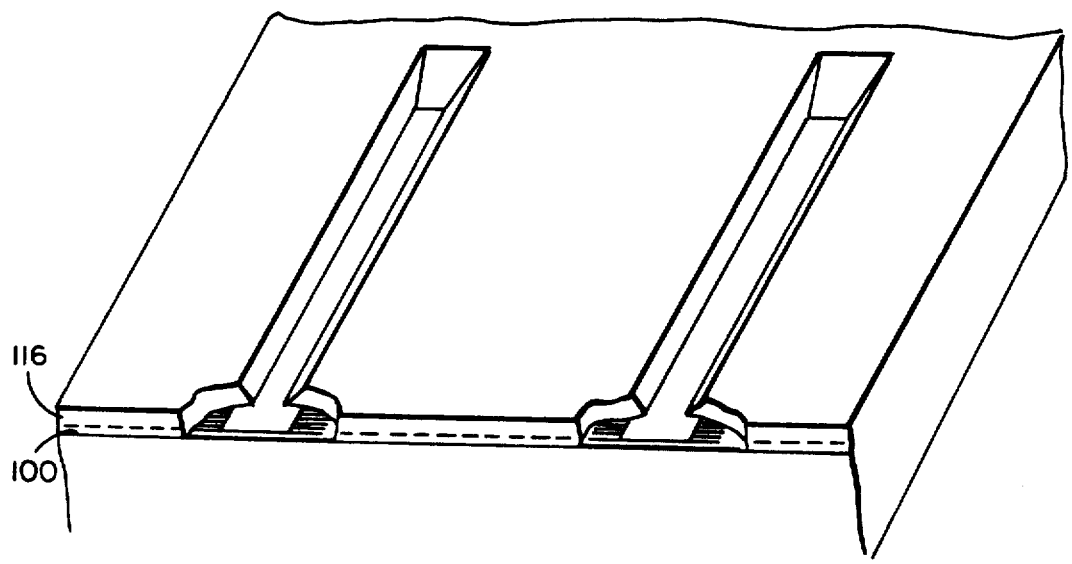
FIG. 12 is a perspective cutaway of the device after epitaxial growth over the metal base layer.
Figure 13:
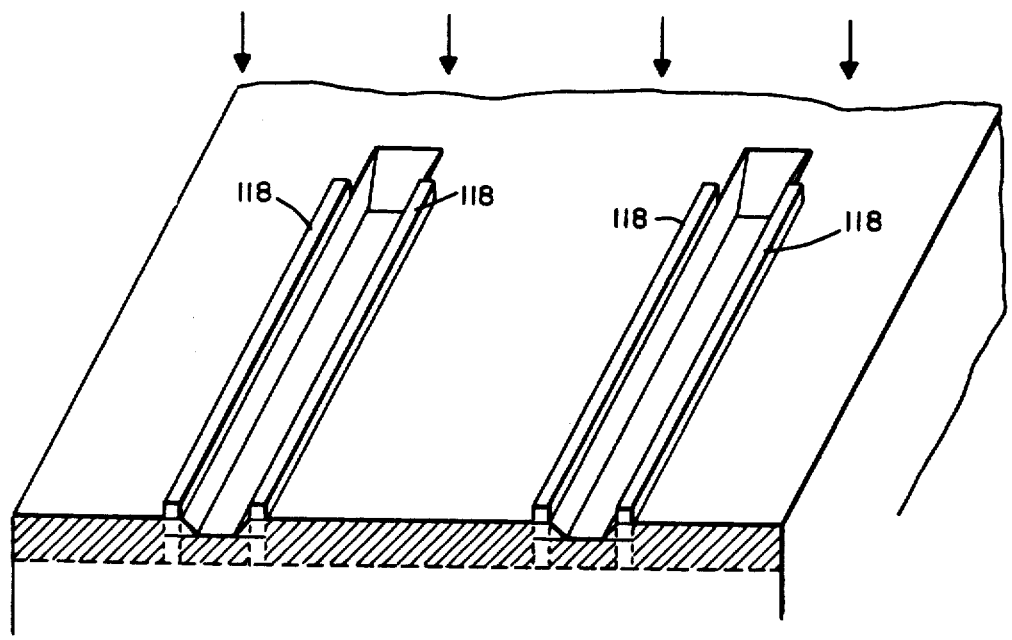
FIG. 13 is a perspective cutaway similar to FIG. 12 after proton bombardment masks have been laid.

After the base comb structures are completed, the wafer is cleaned with a sulfuric acid etch. Then crystal growth, as illustrated in FIG. 12, over the grating teeth and the inactive regions between the gratings is obtained by an organo-metallic chemical vapor deposition (OMCVD). For clean overgrowth, the initial gallium arsenide layer 100 is grown such that the tungsten is applied to a surface which is oriented 5° off the 100 plane. Then, the gratings are applied such that they extend in a direction 40° off the 110 plane. Because lateral overgrowth is limited, the gallium arsenide second epitaxial layer 116 grows over the gratings but does not grow over the solid areas of tungsten. The layer 116 is grown to about one micron depth.

To allow for proton bombardment to create the inactive regions and thus leave active regions 34, 36, 38, and 40, a double layer of photoresist is laid with openings in which a double layer of titanium and gold bars 118 are deposited over the active regions. The photoresist is dissolved and the unwanted titanium/gold is lifted off. The wafer is proton bombarded with a schedule from 50 to 400 KeV. The gold bars are then removed by dissolving the titanium to leave the active regions. The wafers are then annealed.

Figure 14:
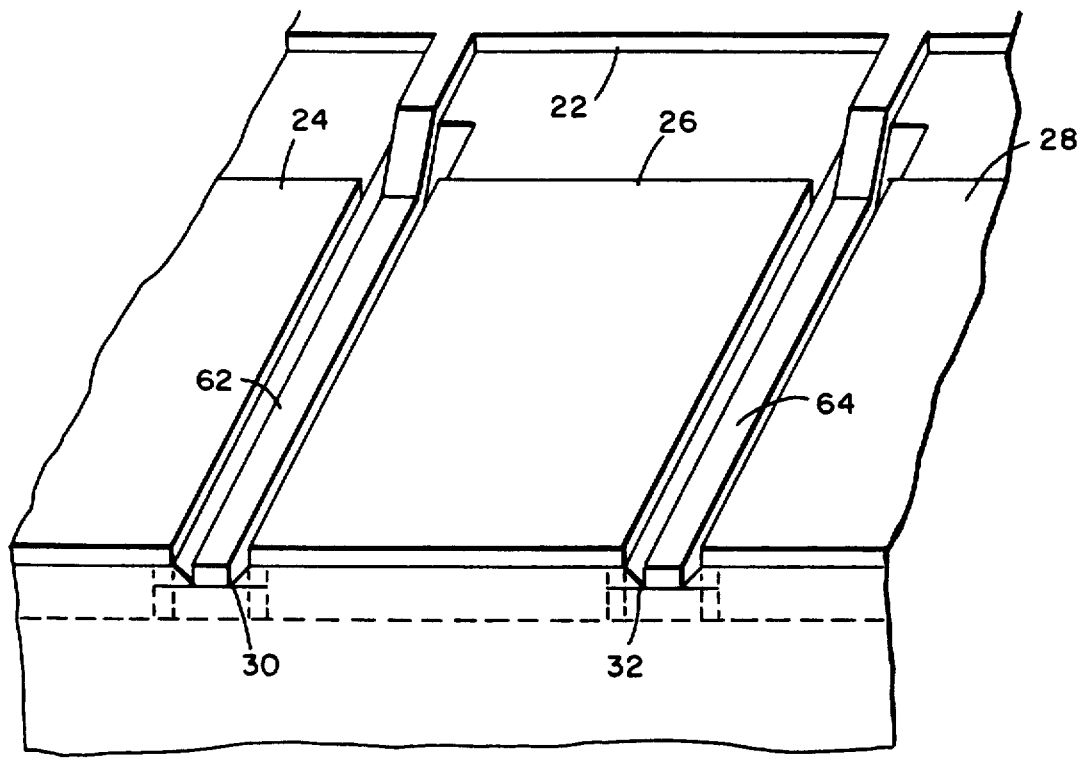
FIG. 14 illustrates the base and collector contacts laid after proton bombardment.

The base and collector contacts are then laid as illustrated in FIG. 14. These contacts are laid by first imaging a double layer photoresist and then depositing the following layers of contact metal. First, layers of nickel (100 angstroms), germanium (120 angstroms) and gold (1,000 angstroms) are laid. In a subsequent alloying step, these layers alloy with the gallium arsenide to form an ohmic contact. Tungsten (1000 angstroms) is then laid to provide a barrier during alloying. Finally, layers of titanium (400 angstroms) and gold (3.7 microns) are laid. The titanium serves as an adhesive for the gold which serves as the collector and base contacts. The photoresist is then removed to lift off excess metal, and the gold, germanium and nickel are alloyed.

This process, in which all contact metal is deposited through a single photoresist mask, results in alloying below the entire collector pads even though such alloying is only required over the active regions. Because the alloying process can cause a reduction in the insulating characteristics of the proton-bombarded inactive regions, a sufficiently large dose of protons is used during the prior bombarding step to maintain the insulating properties. In prior methods, the layers to be alloyed were deposited over only the areas to which ohmic contact was to be made and alloyed prior to the proton bombardment. After bombardment, the remainder of the gold contact was laid. Thus separate masking steps were required for the ohmic contacts and the full contact pads.

The wafer is thinned to 25 to 50 microns using a lapping and etching technique and the emitter contact of nickel, germanium and gold is applied to the backside of the wafer and alloyed to provide a an ohmic contact. Finally, the wafer is cut up to provide discrete devices. The 25 to 50 micron substrate is thinner than the 100 to 150 micron substrates of prior devices. The thin substrates assist in heat dissipation.

Figure 17:
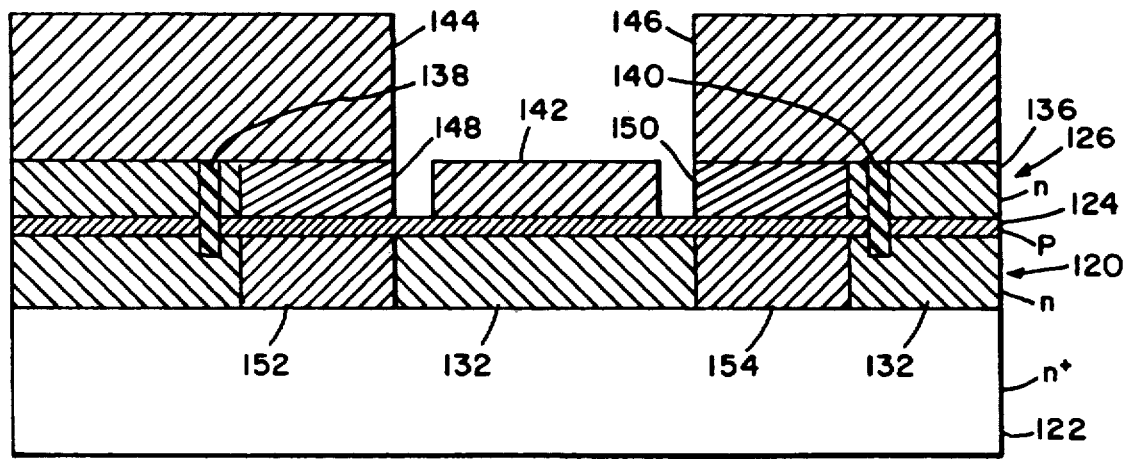
FIG. 17 is a cross-sectional view of a heterojunction bipolar transistor embodying the invention.

FIG. 17 illustrates a heterojunction bipolar transistor embodying the present invention. The heterojunction bipolar transistor is an npn or pnp transistor described in B. Bayraktaroglo, N. Camilleri, H.Q. Tserng, "Al GaAs/GrAs Heterojunction Bipolar Transistors for Power Applications," Proceeding IEEE/Cornell Conference on Advanced Concepts in High Speed Semiconductor Devices and Circuits, Aug. 10, 11, 12, 1987, Cornell University. In this device, a gallium arsenide n-type collector region (second semiconductor region) 120 is grown over a gallium arsenide n+substrate 122. A p-type gallium arsenide base layer 124 is formed over the collector layer, and an n-type gallium aluminium arsenide layer (first semiconductor region) 126 is grown over the base layer. Inactive regions are provided in the two n-type layers at 128, 130, 132, 134 and 136. Because the proton bombardment is not able to insulate the heavily doped p-type regions, regions 138 and 140 are etched out and backfilled with insulator material. A base contact 142 is coupled to the p layer 124, and emitter contacts 144 and 146 are coupled to the active emitter regions 148 and 150. As in the PBT embodiment, the active regions 148, 150, 152 and 154 extend into the sheet of FIG. 16 along a length which is substantially greater than the width and depth of the transistor devices. The contacts 144 and 146 extend laterally over the inactive regions 128 and 136 to provide for heat dissipation and to minimize the current density in those contacts. Central contact is made to an exposed extended portion of the base layer, and extensions from that extended portion serve as the base layers between active emitter and collector regions.

While this invention has been particularly shown and described with references to preferred embodiments thereof, it will be understood by those skilled in the art that various changes in form and details may be made therein without departing from the spirit and scope of the invention as defined by the appended claims For example, the collector contacts may be coupled to a microstrip line rather than to conducting wires. Also, the emitter contact may be formed to the side of the device rather than on the opposite face of the substrate. In such a case, the device would remain vertical, but electrical conduction would then be lateral within the substrate. Thermal conduction might be lateral or vertical depending on the position of the heat sink metal.

In some applications, it may be acceptable to connect the base contact directly to grating teeth without a grating pad. However, the pad offers the advantage of selective embedding which would not require etching of semiconductor material to expose the metal base layer for contact.

As yet another alternative, the base contact may only be connected to an end of the grating pad, but this would result in an increased base resistance and would likely be unsuited to high frequency applications.

We claim:

1. A vertical transistor device comprising:
   an active region of semiconductor material positioned horizontally between inactive regions, the active region comprising a first semiconductor region and a second semiconductor region vertically displaced relative to each other and separated by a control layer, a horizontal length of the active region being substantially greater than its width and depth;
   a control electrical contact coupled to the control layer to one side of the active region along the horizontal length of the active region; and
   a first region electrical contact coupled to the first semiconductor region along the horizontal length of the active region, the first region electrical contact extending in a direction away from the control electrical contact over an inactive region and covering a sufficient area over the inactive region to spread a substantial amount of the heat generated in the active region for vertical heat conduction through the inactive region.

2. A transistor device as claimed in claim 1 wherein the control layer is a metal layer.

3. A transistor device as claimed in claim 2 wherein the control layer comprises a grating through the active region.

4. A transistor device as claimed in claim 3 wherein the grating forms a Schottky barrier for barrier-limited current flow therethrough.

5. A transistor device as claimed in claim 4 wherein the first region electrical contact extending over the inactive region is a gold contact having a thickness of at least 2 microns.

6. A transistor device as claimed in claim 1 comprising plural extended active regions and a first region electrical contact extending between and contacting parallel active regions.

7. A transistor device as claimed in claim 6 wherein a conductive wire is bonded to each of plural first region electrical contacts.

8. A transistor device as claimed in claim 6 wherein the first region electrical contact extending over the inactive region is a gold contact having a thickness of at least 2 microns.

9. A transistor device as claimed in claim 6 wherein the control layer comprises a metal grating through each of the active regions.

10. A transistor device as claimed in claim 9 wherein control layer gratings are formed as teeth from opposite sides of a grating pad in a comb structure.

11. A transistor device as claimed in claim 1 wherein the first region electrical contact is at least half as thick as the active region is wide.

12. A transistor device as claimed in claim 1 wherein the first region electrical contact extending over inactive region is a gold contact having a thickness of at least 2 microns.

13. A transistor device as claimed in claim 1 wherein the width of the first region electrical contact over the active region and inactive region is at least three times the width of the active region.

14. A transistor device as claimed in claim 1 wherein at least 50 percent of the heat generated in the active region is conducted through the first region electrical contact.

15. A vertical transistor device as claimed in claim 1 which is a heterojunction bipolar transistor.

16. A transistor device as claimed in claim 1 wherein the extended horizontal length of the active region is an order of magnitude greater than its width.

17. A vertical transistor device comprising active regions of semiconductor material between inactive regions, each active region comprising a first semiconductor region and a second semiconductor region vertically displaced relative to each other and separated by a control layer, the control layer comprising comb structures of parallel extended fingers to which electrical contact is made and extensions from opposite sides of the extended fingers, the extensions separating the first and second semiconductor regions, a horizontal length of each active region being substantially greater than its width an depth and extending parallel to the extended fingers of the control layer, the device further comprising a first region electrical contact coupled to first semiconductor regions of adjacent active regions along the lengths thereof, the contact extending laterally over an inactive region between the adjacent active regions.

18. A transistor device as claimed in claim 17 wherein a conductive wire is bonded to the fist region electrical contact.

19. A transistor device as claimed in claim 17 wherein the control layer comprises a metal grating through each of the active regions.

20. A transistor device as claimed in claim 19 wherein extensions of the control layer extend from opposite sides of each extended finger.

21. A transistor device as claimed in claim 19 wherein the extensions form a Schottky barrier for barrier-limited current flow therethrough.

22. A transistor device as claimed in claim 17 wherein the first region electrical contact is at least half as thick as the active region is wide.

23. A transistor device as claimed in claim 17 wherein the first region electrical contact extending over the inactive region is a gold contact having a thickness of at least 2 microns.

24. A transistor device as claimed in claim 17 wherein the width of the first region electrical contact over the adjacent active regions and the inactive region is at least six times the width of the active region.

25. A transistor device as claimed in claim 17 wherein at least 50 percent of the heat generated in the active regions is conducted through the first region electrical contact.

26. A vertical transistor device as claimed in claim 17 which is a heterojunction bipolar transistor.

27. A transistor device as claimed in claim 17 wherein the extended horizontal length of each active region is an order of magnitude greater than its width.

28. A vertical transistor device comprising active regions of semiconductor material between inactive regions, each active region comprising first and second semiconductor regions vertically displaced relative to each other and separated by a metal control layer, the control layer comprising combs, the combs comprising parallel pads to which electrical contact is made and grating teeth from the sides of the pads, the active regions extending along the parallel combs above and below the grating teeth, the device further comprising a first region electrical contact coupled to adjacent first semiconductor regions along the lengths thereof, the contacts extending laterally over an inactive region between the adjacent first semiconductor regions.

29. A transistor device as claimed in claim 28 wherein the grating teeth form a Schottky barrier for barrier-limited current flow therethrough.

30. A transistor device as claimed in claim 28 wherein a conductive wire is bonded to the first region electrical contact.

31. A transistor device as claimed in claim 28 wherein the first region electrical contact is at least about half as thick as the active region is wide.

32. A transistor device as claimed in claim 28 wherein the first region electrical contact extending over the inactive region is a gold contact having a thickness of at least 2 microns.

33. A transistor device as claimed in claim 28 wherein the width of the first region electrical contact over the adjacent first semiconductor regions and the inactive region is at least six times the width of the active region.

34. A transistor device as claimed in claim 28 wherein at least 50 percent of the heat generated in the active regions is conducted through the first region electrical contact.

35. A transistor device as claimed in claim 28 wherein an extended horizontal length of each active region extending parallel to the pads is an order of magnitude greater than its horizontal width.

* * * * *